(12) United States Patent
Kollata et al.

(10) Patent No.: US 8,142,260 B2
(45) Date of Patent: Mar. 27, 2012

(54) METHODS AND APPARATUS FOR REMOVAL OF FILMS AND FLAKES FROM THE EDGE OF BOTH SIDES OF A SUBSTRATE USING BACKING PADS

(75) Inventors: Eashwer Kollata, Sunnyvale, CA (US); Shou-Sung Chang, Stanford, CA (US); Zhenhua Zhang, San Jose, CA (US); Paul D. Butterfield, San Jose, CA (US); Sen-Hou Ko, Sunnyvale, CA (US); Antoine P. Manens, Sunnyvale, CA (US); Gary C. Ettinger, Cupertino, CA (US); Ricardo Martinez, Manteca, CA (US)

(73) Assignee: Applied Materials, Inc., Santa Clara, CA (US)

( * ) Notice: Subject to any disclaimer, the term of this patent is extended or adjusted under 35 U.S.C. 154(b) by 960 days.

(21) Appl. No.: 12/124,142

(22) Filed: May 20, 2008

(65) Prior Publication Data

US 2008/0293340 A1  Nov. 27, 2008

Related U.S. Application Data

(60) Provisional application No. 60/939,342, filed on May 21, 2007.

(51) Int. Cl.
*B24B 1/00* (2006.01)
(52) U.S. Cl. ............... 451/44; 451/168; 451/173
(58) Field of Classification Search .......... 451/41, 451/44, 163, 168, 173, 174
See application file for complete search history.

(56) References Cited

U.S. PATENT DOCUMENTS

| | | | |
|---|---|---|---|
| 4,533,399 A | 8/1985 | Mencke | |
| 5,117,590 A | 6/1992 | Kudo et al. | |
| 5,317,836 A | 6/1994 | Hasegawa et al. | |
| 6,231,429 B1 | 5/2001 | Lisec | |
| 6,257,953 B1 | 7/2001 | Gitis et al. | |
| 6,302,769 B1 | 10/2001 | Nishi et al. | |
| 6,306,016 B1 * | 10/2001 | Steere et al. | 451/44 |
| 6,402,596 B1 | 6/2002 | Hakomori et al. | |
| 6,488,567 B1 | 12/2002 | Flanders et al. | |
| 6,558,239 B2 | 5/2003 | Kunisawa et al. | |
| 6,629,875 B2 | 10/2003 | Steere | |
| 6,641,464 B1 * | 11/2003 | Steere, III | 451/41 |
| 6,685,539 B1 | 2/2004 | Enomoto et al. | |
| 6,739,947 B1 | 5/2004 | Molnar | |
| 6,773,335 B2 | 8/2004 | Hakomori | |

(Continued)

FOREIGN PATENT DOCUMENTS

JP    08001494 A  *  1/1996

OTHER PUBLICATIONS

U.S. Appl. No. 12/427,504, filed Apr. 21, 2009.

(Continued)

*Primary Examiner* — Maurina Rachuba
(74) *Attorney, Agent, or Firm* — Dugan & Dugan, PC

(57) ABSTRACT

Apparatus and methods are provided to polish an edge of a substrate. The invention includes a polishing head adapted to retain a backing pad having a selected contour, wherein the polishing head is adapted to press the backing pad against an edge of a substrate. Numerous other aspects are provided.

20 Claims, 9 Drawing Sheets

U.S. PATENT DOCUMENTS

| | | |
|---|---|---|
| 6,933,234 B2 | 8/2005 | Nakamura et al. |
| 7,066,787 B2 | 6/2006 | Nakanishi et al. |
| 7,217,662 B2 | 5/2007 | Toyota et al. |
| 7,351,131 B2 | 4/2008 | Nakamura et al. |
| 7,367,873 B2 | 5/2008 | Ishii et al. |
| 7,621,799 B2 | 11/2009 | Sakairi |
| 7,744,445 B2 | 6/2010 | Kubota et al. |
| 2001/0011002 A1 | 8/2001 | Steere |
| 2001/0052159 A1 | 12/2001 | Moinpour et al. |
| 2002/0007840 A1 | 1/2002 | Atoh |
| 2002/0098787 A1 | 7/2002 | Kunisawa et al. |
| 2002/0142707 A1 | 10/2002 | Shimada et al. |
| 2004/0185751 A1* | 9/2004 | Nakanishi et al. ............... 451/5 |
| 2005/0250331 A1* | 11/2005 | Arai et al. ..................... 438/691 |
| 2006/0243304 A1 | 11/2006 | Hsu et al. |
| 2006/0252355 A1 | 11/2006 | Kumasaka |
| 2007/0131653 A1 | 6/2007 | Ettinger et al. |
| 2007/0131654 A1 | 6/2007 | Wasinger et al. |
| 2007/0238393 A1 | 10/2007 | Shin et al. |
| 2008/0188167 A1 | 8/2008 | Ishii et al. |
| 2008/0291448 A1 | 11/2008 | Chen et al. |
| 2008/0293329 A1 | 11/2008 | Miller |
| 2008/0293331 A1 | 11/2008 | Chen et al. |
| 2008/0293333 A1 | 11/2008 | Zhang et al. |
| 2008/0293334 A1* | 11/2008 | Kollata et al. .................. 451/41 |
| 2008/0293335 A1 | 11/2008 | Ettinger et al. |
| 2008/0293336 A1 | 11/2008 | Zhang et al. |
| 2008/0293337 A1 | 11/2008 | Zhang et al. |
| 2008/0293341 A1 | 11/2008 | Kollata et al. |
| 2008/0293344 A1 | 11/2008 | Ettinger et al. |
| 2009/0017730 A1* | 1/2009 | Kubota et al. .................. 451/41 |
| 2009/0017731 A1 | 1/2009 | Ettinger et al. |
| 2009/0017733 A1 | 1/2009 | Takahashi et al. |
| 2009/0029629 A1 | 1/2009 | Shin et al. |
| 2009/0036033 A1 | 2/2009 | Wasinger et al. |
| 2009/0036039 A1 | 2/2009 | Shin et al. |
| 2009/0036042 A1 | 2/2009 | Shin et al. |
| 2009/0117828 A1* | 5/2009 | Hongo et al. ..................... 451/6 |
| 2010/0136886 A1* | 6/2010 | Hongo et al. ..................... 451/6 |

OTHER PUBLICATIONS

Apr. 6, 2011 Response to Office Action of U.S. Appl. No. 12/124,147 mailed Jan. 7, 2011.

Office Action of U.S. Appl. No. 12/124,147 mailed Jan. 7, 2011.

International Search Report and Written Opinion of International Application No. PCT/US07/07568 mailed on Jun. 24, 2008.

U.S. Appl. No. 60/939,351, filed May 21, 2007.
U.S. Appl. No. 60/939,353, filed May 21, 2007.
U.S. Appl. No. 60/939,342, filed May 21, 2007.
U.S. Appl. No. 60/939,219, filed May 21, 2007.
U.S. Appl. No. 60/939,350, filed May 21, 2007.
U.S. Appl. No. 60/939,344, filed May 21, 2007.
U.S. Appl. No. 60/939,333, filed May 21, 2007.
U.S. Appl. No. 60/939,212, filed May 21, 2007.
U.S. Appl. No. 60/939,337, filed May 21, 2007.
U.S. Appl. No. 60/939,228, filed May 21, 2007.
U.S. Appl. No. 60/939,209, filed May 21, 2007.

International Search Report and Written Opinion of International Application No. PCT/US06/46765 mailed on Oct. 2, 2007.

"Silicon Wafer Edge Polishing Machine", Jul. 2000, MIPOX The Surface Technology Experts, [http://www.mipox.com/wafer_edg_polishing_machine.htm], printed on Jul. 20, 2005, pp. 1-2.

"Mipox—The Surface Technology Expert", Jul. 2000, MIPOX The Surface Technology Experts, [http://www.mipox.com/aboutus.htm], printed on Jul. 20, 2005, pp. 1-2.

"ALTB 200VT Auto Tape Burnish Machine", Jul. 2000, MIPOX The Surface Technology Experts, [http://www.mipox.com/tape_burnish_machine.htm], printed on Jul. 20, 2005, pp. 1-2.

"The Mipox Silicon Wafer Edge Polishing Machine", MIPOX Products Catalogue [http://www.mipox.com.my/info-products5.htm], printed on Jul. 20, 2005, pp. 1-2.

"Silicon Wafer Edge Polisher", Nihon Micro Coating Co., Ltd. Nano-Surface Technology Solution, Products & Services [http://www.mipox.co.jp/en/products/2a_machine/poli.html], printed on Jul. 20, 2005, pp. 1-2.

Office Action of U.S. Appl. No. 12/124,147 mailed Jun. 28, 2011.

Interview Summary of U.S. Appl. No. 12/124,147 filed Aug. 12, 2011.

Aug. 18, 2011 Response to Office Action of U.S. Appl. No. 12/124,147 mailed Jun. 28, 2011.

Final Office Action of U.S. Appl. No. 12/124,147 mailed Nov. 14, 2011.

* cited by examiner

METHODS AND APPARATUS FOR REMOVAL OF FILMS AND FLAKES FROM THE EDGE OF BOTH SIDES OF A SUBSTRATE USING BACKING PADS

The present application claims priority from U.S. Provisional Patent Application Ser. No. 60/939,342, filed May 21, 2007, entitled "METHODS AND APPARATUS FOR REMOVAL OF FILMS AND FLAKES FROM THE EDGE OF BOTH SIDES OF A SUBSTRATE USING BACKING PADS" is hereby incorporated herein by reference in its entirety for all purposes.

CROSS-REFERENCE TO RELATED APPLICATIONS

The present application is related to the following commonly-assigned, co-pending U.S. Patent Applications, each of which is hereby incorporated herein by reference in its entirety for all purposes:

U.S. patent application Ser. No. 11/299,295 filed on Dec. 9, 2005 and entitled "METHODS AND APPARATUS FOR PROCESSING A SUBSTRATE";

U.S. patent application Ser. No. 11/298,555 filed on Dec. 9, 2005 and entitled "METHODS AND APPARATUS FOR PROCESSING A SUBSTRATE";

U.S. patent application Ser. No. 11/693,695 filed on Mar. 29, 2007 and entitled "METHODS AND APPARATUS FOR POLISHING AN EDGE OF A SUBSTRATE";

U.S. Patent Application Ser. No. 60/939,351, filed May 21, 2007, entitled "METHODS AND APPARATUS FOR POLISHING A NOTCH OF A SUBSTRATE USING AN INFLATABLE POLISHING WHEEL";

U.S. Patent Application Ser. No. 60/939,353, filed May 21, 2007, entitled "METHODS AND APPARATUS FOR FINDING A SUBSTRATE NOTCH CENTER";

U.S. Patent Application Ser. No. 60/939,343, filed May 21, 2007, entitled "METHODS AND APPARATUS TO CONTROL SUBSTRATE BEVEL AND EDGE POLISHING PROFILES OF EPITAXIAL FILMS";

U.S. Patent Application Ser. No. 60/939,219, filed May 21, 2007, entitled "METHODS AND APPARATUS FOR POLISHING A NOTCH OF A SUBSTRATE USING A SHAPED BACKING PAD";

U.S. Patent Application Ser. No. 60/939,350, filed May 21, 2007, entitled "METHODS AND APPARATUS FOR USING A BEVEL POLISHING HEAD WITH AN EFFICIENT TAPE ROUTING ARRANGEMENT";

U.S. Patent Application Ser. No. 60/939,344, filed May 21, 2007 entitled "METHODS AND APPARATUS FOR USING A ROLLING BACKING PAD FOR SUBSTRATE POLISHING";

U.S. Patent Application Ser. No. 60/939,333, filed May 21, 2007, entitled "METHODS AND APPARATUS FOR SUBSTRATE EDGE POLISHING USING A POLISHING ARM";

U.S. Patent Application Ser. No. 60/939,212, filed May 21, 2007, entitled "METHODS AND APPARATUS FOR IDENTIFYING A SUBSTRATE EDGE PROFILE AND ADJUSTING THE PROCESSING OF THE SUBSTRATE ACCORDING TO THE IDENTIFIED EDGE PROFILE";

U.S. Patent Application Ser. No. 60/939,337, filed May 21, 2007, entitled "METHODS AND APPARATUS FOR HIGH PERFORMANCE SUBSTRATE BEVEL AND EDGE POLISHING IN SEMICONDUCTOR MANUFACTURE";

U.S. Patent Application Ser. No. 60/939,228, filed May 21, 2007, entitled "METHODS AND APPARATUS FOR POLISHING A NOTCH OF A SUBSTRATE BY SUBSTRATE VIBRATION"; and U.S. Patent Application Ser. No. 60/939,209, filed May 21, 2007, entitled "METHODS AND APPARATUS FOR CONTROLLING THE SIZE OF AN EDGE EXCLUSION ZONE OF A SUBSTRATE".

FIELD OF THE INVENTION

The present invention relates generally to substrate processing, and more particularly to methods and apparatus for cleaning an edge of a substrate.

BACKGROUND OF THE INVENTION

Substrates are used in semiconductor device manufacturing. During processing, a film and/or flakes may be deposited on the surface of the substrate. However, it may be undesirable to have this film and/or flakes on the edge of the substrate, as it may negatively affect the semiconductor devices. Conventional systems, which contact a substrate edge with an abrasive tape to clean the edge, may not thoroughly clean the edge. For example, the abrasive tape may not sufficiently contact both bevels of the edge during cleaning. The inability to sufficiently clean the substrate may affect semiconductor device manufacturing throughput. Accordingly improved methods and apparatus for cleaning an edge of a substrate are desired.

SUMMARY OF THE INVENTION

In aspects of the invention, an apparatus is provided for polishing an edge of a substrate. The apparatus comprises a backing pad coupled to a polishing head, wherein the backing pad has a selected contour, and wherein the polishing head is adapted to press the backing pad against an edge of a substrate.

In other aspects of the invention, a system is provided for polishing an edge of a substrate. The system comprises a substrate support adapted to rotate a substrate; a backing pad coupled to a polishing head, wherein the backing pad has a selected contour, and wherein the polishing head is adapted to press the backing pad against an edge of the substrate; and a controller adapted to operate the rotation of the substrate and the polishing head.

In yet other aspects of the invention, a method is provided for polishing an edge of a substrate. The method comprises rotating a substrate; contacting an edge of a substrate with polishing tape, wherein the polishing tape is contacted by the polishing strip section of the backing pad via a polishing head; and determining that a pre-set amount of film has been removed from the substrate edge.

Other features and aspects of the present invention will become more fully apparent from the following detailed description, the appended claims and the accompanying drawings.

DETAILED DESCRIPTION

Figure 1:
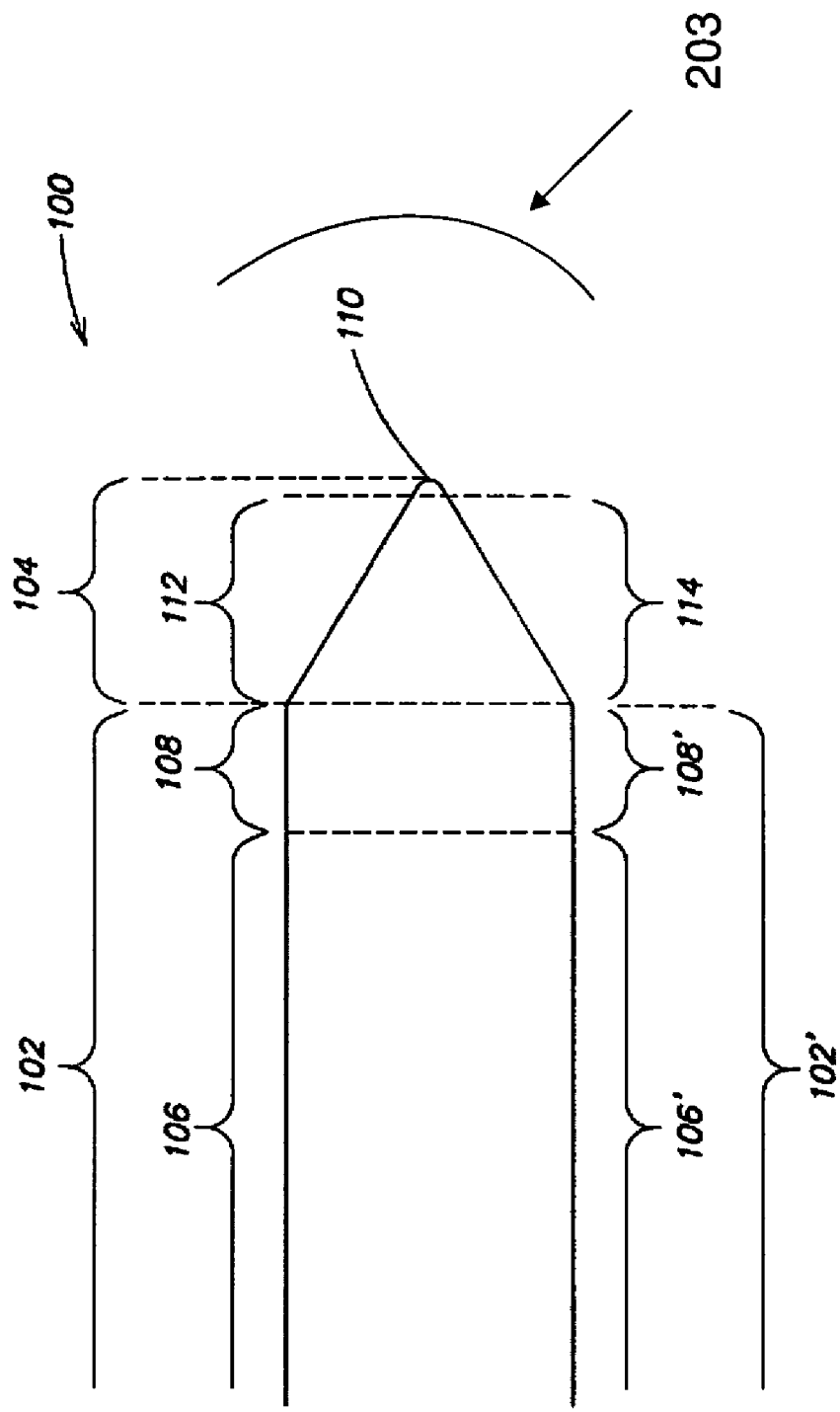
FIG. 1 is a schematic illustration of a cross-section of a portion of a substrate.

The present invention provides improved methods and apparatus for cleaning and/or polishing the edge of a substrate. The edge of a substrate may be polished by application of an abrasive polishing pad or abrasive polishing tape contacting the substrate edge via a polishing head, for example, as the substrate is rotated or otherwise moved (e.g., oscillated). In some embodiments, the backing pad may contact a non-abrasive side of the polishing tape, such that the polishing tape contacts and polishes the substrate. According to the present invention, the surface of the polishing or backing pad may have contours which may be mapped onto, or correspond to, locations on the substrate where film removal is desired. In other words, the surface shape of the backing pad may be angled, for example, such that when the backing pad contacts the substrate edge (in some instances via the polishing tape), the backing pad (through the polishing tape) may impose its own shape onto the substrate 100 and may remove a corresponding profile or area of film from the substrate edge. With reference to FIG. 1, a substrate 100 may include two major surfaces 102, 102', and an edge 104. Each major surface 102, 102' of the substrate 100 may include a device region 106, 106' and an exclusion region 108, 108'. (Typically however, only one of the two major surfaces 102, 102' will include a device region and an exclusion region.) The exclusion regions 108, 108' may serve as buffers between the device regions 106, 106' and the edge 104. The edge 104 of a substrate 100 may include an outer edge 110 and bevels 112, 114. The bevels 112, 114 may be located between the outer edge 110 and the exclusion regions 108, 108' of the two major surfaces 102, 102'. The present invention is adapted to clean and/or polish all or part of the exclusion regions 108, 108', the outer edge 110, and at least one bevel 112, 114 of a substrate 100 without affecting the device regions 106, 106'.

Figure 2:
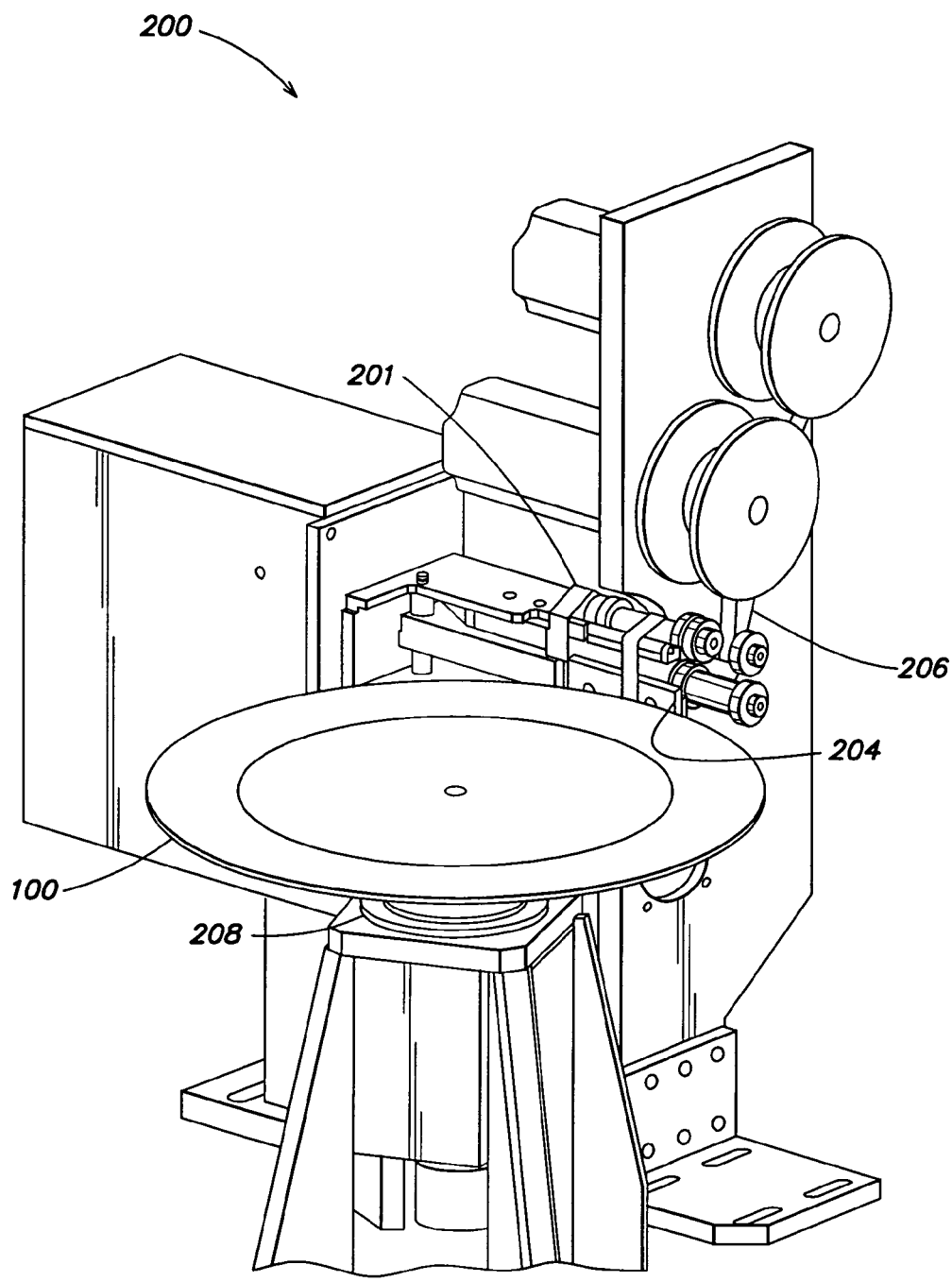
FIG. 2 is a schematic illustration of an example embodiment of a polishing head adapted to polish the edge of a substrate according to the present invention.

Turning to FIG. 2, a schematic illustration of an example embodiment of a polishing head apparatus 200, including a polishing head 201, adapted to polish the exclusion regions 108, 108' and the edge 104 of the substrate 100 is depicted. The substrate 100 may be held and rotated, for example, by a vacuum chuck 208. Other substrate rotation means may be used (e.g., driver rollers and guide rollers, etc.). The polishing head 201 may include a backing pad 204. In some embodiments, the backing pad 204 may be inflatable. In either case, the backing pad 204 and/or inflatable pad may be soft and/or include, or develop, contours to conform to the shape of the substrate edge 104. The backing pad 204 may be used to polish the substrate exclusion regions 108, 108' and the edge 104. Additionally or alternatively, the backing pad 204 may be pressed against a polishing tape 206, used to polish the substrate exclusion regions 108, 108' and the edge 104. As the substrate 100 rotates, the backing pad 204 may be pushed by an actuator (e.g., a pneumatic slide, hydraulic ram, servo motor driven pusher, etc.) (not shown), such that the backing pad 204, and hence the polishing tape 206, may be pressed against the substrate edge 104 (and edge exclusion zones 108, 108'). Alternatively or additionally, the actuator may be adjustable, and may be used to also push the entire head 201 toward the substrate 100. Alternatively, a biasing device (e.g., a spring) may be employed to mount the pad 204 to the head 201 to provide flexible/dynamic counter pressure to the pad 204. The substrate 100 may contact the polishing tape 206 for about 15 to 150 seconds depending on the type of tape used, the grit of the tape, the rate of rotation, the amount of polishing required, etc. More or less time may be used. The contact between the backing pad 204 (and abrasive or polishing tape 206) and the substrate exclusion regions 108, 108' and the edge 104, combined with the particular rotation speed of the substrate 100, may provide relative movement between the abrasive tape 206 and the substrate exclusion regions 108, 108' and edge 104, resulting in the substrate exclusion regions 108, 108' and the edge 104 being polished. Depending on the amount of force applied by the actuator, the resiliency of the pad selected, the amount of inflation of an inflatable pad, and/or the amount of tension on the polishing tape, a controlled amount of pressure may be applied to polish the substrate edge 104 (and edge exclusion zones 108, 108'). Thus, the present invention provides precise control of an edge polish process, which may be used to compensate for different edge geometries and changes in the substrate 100 as material is removed from the edge 104.

The pad 204 may be made of material such as, for example, an acetal resin (e.g., Delrin® manufactured by DuPont Corporation), PVDF, polyurethane closed cell foam, silicon rubber, PTFE, PEEK, ceramics, stainless steel etc. Other materials may be used. Such materials may have resilience or an ability to conform that is a function of the thickness or density of the pad. The material may be selected based upon its resilience. The desired resilience may be selected based upon the type of polishing required.

In some embodiments, the pad 204 may have an adjustable amount of ability to conform to the substrate's edge 104 (and edge exclusion zones 108, 108'), or other areas to be polished. For example the pad 204 may be, or include an inflatable bladder, inflatable by air, liquid or other fluid.

The substrate 100 may be rotated in a horizontal plane. The substrate edge 104 may be aligned with, or normal to, the polishing tape 206, pad 204 and/or polishing head 201. In additional or alternative embodiments, the substrate 100 may be rotated in a vertical plane, other non-horizontal plane, and/or be moved between different planes of rotation.

In the embodiment described herein, as the substrate 100 rotates, the polishing head 201 may rock around the substrate exclusion regions 108, 108' and the edge 104 to polish the entire exclusion regions 108, 108' and the edge 104 as indicated by the curved arc 203 in FIG. 1. The selected angle of rocking along the arc 203, may include, for example, plus or minus 90 degrees. Other rocking angles may be used. In operation, the polishing head 201 may be "rocked" by angularly translating the head 201, and consequently, the backing pad 204 and polishing tape 206 in contact with and contoured to the exclusion regions 108, 108' and edge 104 of a substrate 100, around an axis that is tangential to the outer edge 110 of the substrate 100 as it is rotated. In some embodiments, the head 201 may be adapted to continuously or intermittently oscillate between the various positions. The head 201 may be moved by drivers (not shown) under the direction of a programmed or user operated controller. Alternatively, the head 201 may be fixed and/or only adjusted while the substrate 100 is not being rotated. In yet other embodiments, the substrate 100 may be held fixed while the head 201 is oscillated (as described above) as well as rotated circumferentially around the substrate 100. The key parameters to control the edge polishing area may be the angle of rocking, the center of rotation for rocking, and the contour of the backing pad.

In some embodiments, fluids used to aid in the polishing or washing away of accumulated particles, may be delivered to the substrate edge 104 (and edge exclusion zones 108, 108'). The chemicals may be sprayed directly onto the substrate 100, at the substrate/abrasive tape interface, and/or may be applied to and/or through the tape and/or the pad 204. A fluid channel (not shown) may be provided to drip or spray the fluid on or into the pads 204. Alternatively, an inflatable pad 204 may include a bladder (not shown) with a semi-permeable membrane that allows fluid to be slowly released and transmitted to the polishing tape 206 (e.g., through the pad). In such embodiments, the pad 204 may be covered by, made of, and/or include material that absorbs and/or retains the fluids used (e.g., polyvinyl alcohol (PVA), etc.). Additionally, the present invention may employ gravity or suction to cause the runoff not to contaminate or contact other parts of the substrate 100 or apparatus of the invention. Further, energy (e.g., megasonic energy) may be applied to the substrate edge 104 (and edge exclusion zones 108, 108') via fluid carrying such energy.

As described above, in some embodiments, a controller 304 (shown in FIG. 3) (e.g., a programmed computer, a programmed processor, a gate array, a logic circuit, an operator directed valve system, an embedded real time processor, etc.) may control the driver(s) used to rotate the substrate 100, and the actuator used to push the pad 204 against the exclusion regions 108, 108' and substrate edge 104. Note that the controller 304 may be coupled (e.g., electrically, mechanically, pneumatically, hydraulically, etc.) to each of a plurality of actuators. Likewise, operation of the fluid channels may also be under the direction of the controller 304. Under direction of the controller 304, various fluids may be selectively delivered to the pads 204 and/or the substrate exclusion regions 108, 108' and edge 104 via the fluid channels. The controller 304 may be adapted to receive feedback signals from the driver and/or actuator that indicate the amount of energy being exerted to drive the substrate 100 (e.g., rotate a vacuum chuck holding the substrate 100) and/or actuate the actuator to push the pad, respectively. These feedback signals may be employed to determine when a particular selected layer of film has been removed and/or whether a sufficient or selected amount of polishing has occurred.

Figure 3:
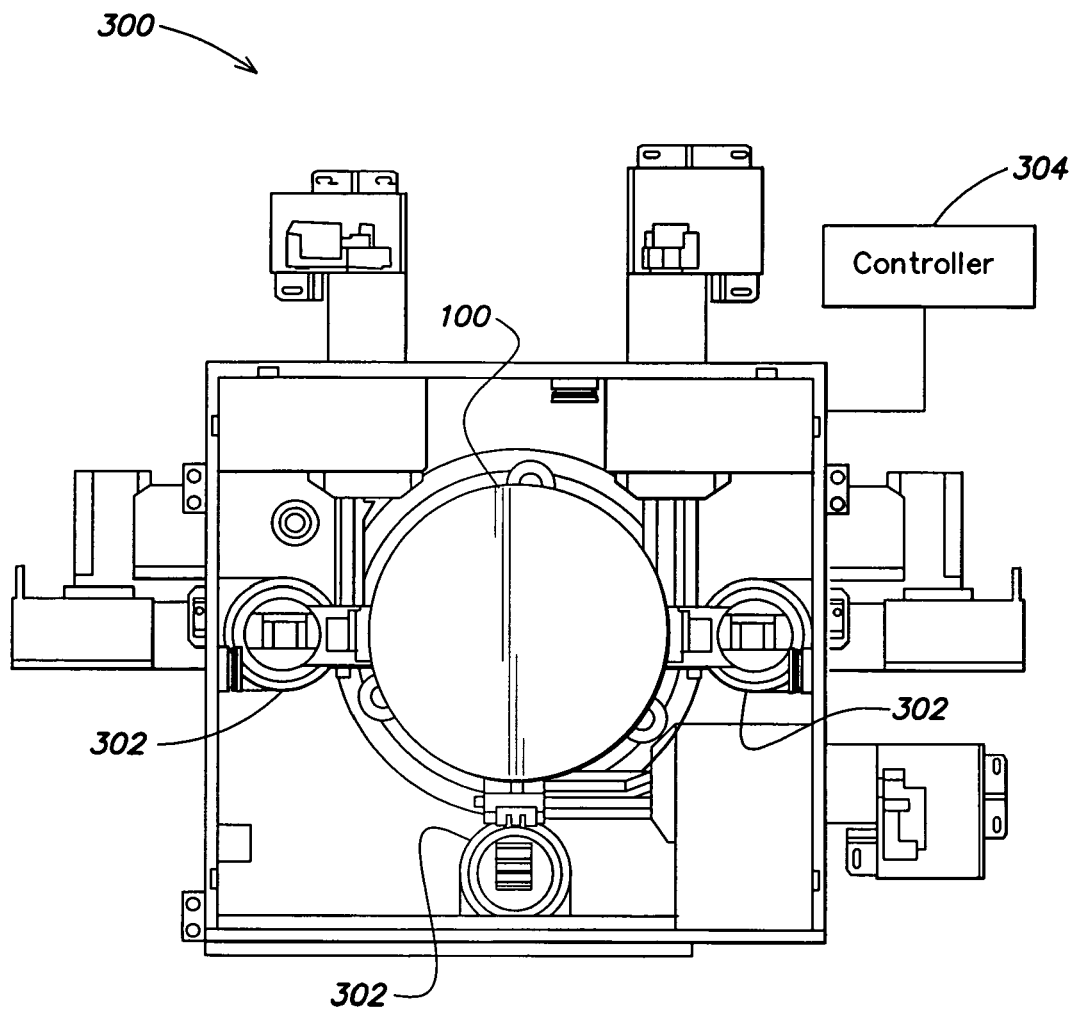
FIG. 3 is a perspective view depicting an example embodiment of a film polishing system according to the present invention.

FIG. 3 is a perspective view depicting an example embodiment of a substrate polishing system 300 according to the present invention. FIG. 3 depicts a substrate polishing system 300 including three heads 302. As suggested by FIGS. 2 and 3, any number and type of heads 302 may be used in any practicable combination. In addition, in such multi-head embodiments, each head 302 may use a differently selected contoured backing plate or pad (e.g., different contours of the strip-like feature 404, shown in FIG. 4A, for example, etc.). Any number of heads 302 may be used concurrently, individually, and/or in a sequence. The heads 302 may be disposed in different positions, and in different orientations (e.g., aligned with the substrate edge 104, normal to the substrate edge 104, angled relative to the substrate edge 104, etc.) to allow the polishing pad strip (described below) to polish different portions of the rotating substrate edge 104 (and edge exclusion zones 108, 108'). The heads 302 may be adapted to be oscillated or moved (e.g., angularly translated about a tangential axis of the substrate 100 and/or circumferentially relative to the substrate 100) around or along the substrate edge 104 by the frame so as to polish different portions of the substrate edge 104 (and edge exclusion zones 108, 108'). Different heads 302 may be used for different substrates 100, different types of substrates 100, or different polishing processes. Substrate polishing may be performed using one or more polishing apparatuses. In one or more embodiments, a plurality of polishing apparatuses may be employed, in which each polishing apparatus may have similar or different characteristics and/or mechanisms. In the latter case, particular polishing apparatuses may be employed for specific operations. For example, one or more of a plurality of polishing apparatuses may be adapted to perform relatively rough/coarse polishing and/or adjustments, while another one or more of the plurality of polishing apparatus may be adapted to perform relatively smooth/fine polishing and/or adjustments. Polishing apparatuses may be used in sequence so that, for example, a rough polishing procedure may be performed initially and a fine polishing procedure may be employed subsequently to make adjustments to a relatively rough polish as needed or according to a polishing recipe. The plurality of polishing apparatuses may be located in a single chamber or module, or alternatively, one or more polishing apparatuses may be located in separate chambers or modules. Where multiple chambers are employed, a robot or another type of transfer mechanism may be employed to move substrates between the chambers so that polishing apparatuses in the separate chambers may be used in series or otherwise.

Figure 4A:
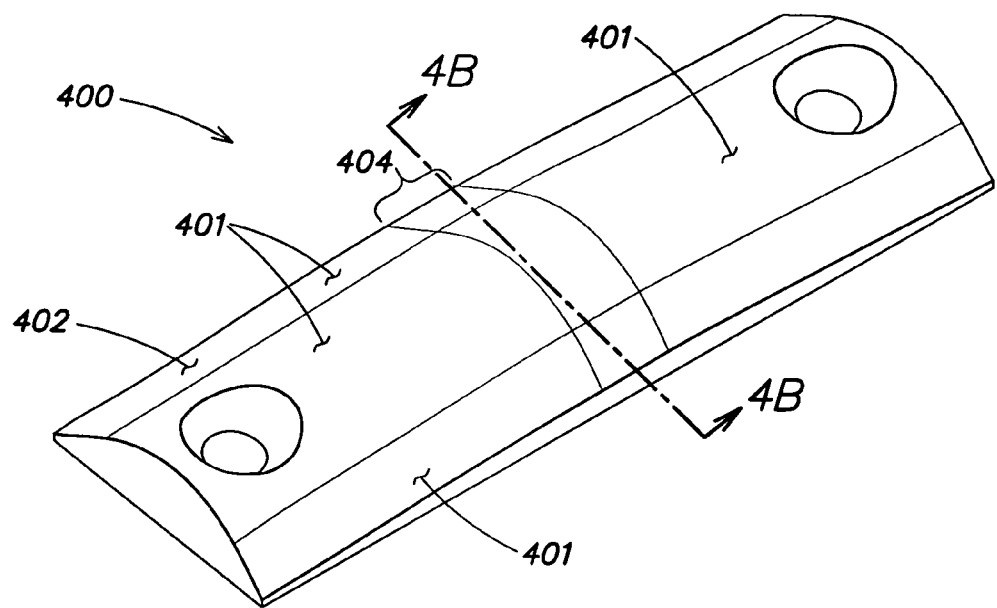
FIGS. 4A, 4B and 4C are example embodiments of a backing pad according to the present invention.
Figure 4B:
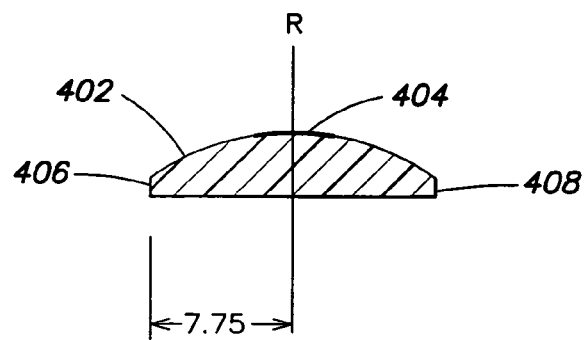

Turning to FIGS. 4A and 4B, an example embodiment of a backing pad 400 according to the present invention is depicted. In FIG. 4A, a curved top surface 402 of the backing pad 400 has symmetrical contours 401 in perpendicular directions from a central location, providing a strip-like feature 404 on the top surface 402. In the example embodiment shown herein, the center of rotation (R), shown in cross-section FIG. 4B, may act as the central location. Other central locations may be used. In some embodiments, the strip 404 may be the only region of the backing pad 400 that contacts a smooth backside of the polishing tape 206, whose abrasive side in turn polishes the substrate exclusion regions 108, 108' and the substrate edge 104, as described above with respect to FIG. 2. The symmetrical contours 401 of the strip 404, may provide symmetrical controlled removal of film from the exclusion regions 108, 108', the top and bottom bevels 112, 114, as well as the outer edge 110 of the substrate 100. Based on the shape of symmetrical contours 401, the width of the strip 404 may be optimized for best removal rate and performance. In addition, variations in removal area may be achieved by changing the rocking angles of the head 201, for example, the conformity/resilience of the pad, the contours of the strip 404, etc.

FIG. 4B is a cross-section taken along line 4B-4B of FIG. 4A. As shown herein, an axis of rotation (R) is centered, such that, for example, the centered axis is 7.75 mm from each of a first and second edge 406, 408 of the backing pad 400. Other measurements may be used. In some embodiments the axis of rotation (R) may be selected by a user, and may be based on a particular polishing procedure.

Figure 4C:
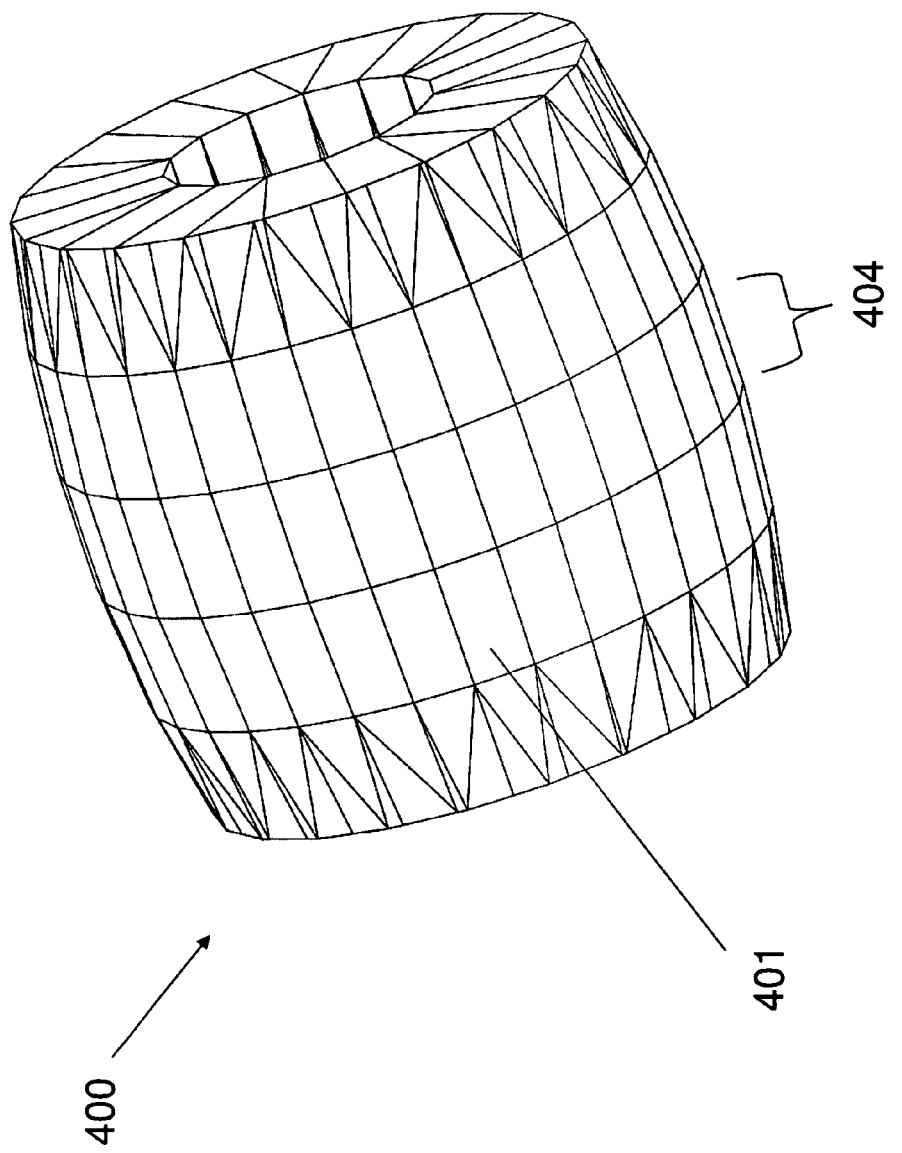

In alternate embodiments, the backing pad 400 may have a semi-spherical or convex shape, such as the roller backing pad 400 shown in FIG. 4C. The roller backing pad 400 may include the same contours 401 and polishing strip 404 as the backing pad shown in FIGS. 4A and 4B. In some embodiments, the radius of the convex contour may range from approximately 25 mm to approximately 50 mm. Other dimensions may be used. The dimensions of the convex contour may affect the contact of the polishing tape 206 against the substrate 100, and may therefore impact the rate of removal of the film. The roller backing pad 400 may rotate as the polishing strip 404 is pressed against the polishing tape 206, which may in turn be pressed against the substrate edge 104 (including the edge exclusion zone 108, 108' in some embodiments). In some embodiments, the polishing strip 404 may range from 7 to 8 mm, for example. Other polishing strip 404 widths may be used. In some embodiments, the rotation of the substrate may apply a perpendicular force to the polishing tape 206, which may cause the polishing tape 206 to slip, in the same direction as the perpendicular force, from a flat surface (not shown) of the backing pad 400, for example. In some embodiments, the combination of the perpendicular force, the flat surface and a misalignment of the backing pad 400 and the polishing tape 206 may cause the polishing tape 206 to slip off of the backing pad 400. However, the convex contour, and in particular the polishing strip 404, on the roller backing pad 400 may help prevent or minimize the polishing tape 206 from slipping off of the roller backing pad 400 during the polishing process. The rotation of the roller backing pad 400 with the polishing tape 206 may create less friction therebetween than with the non-rotating backing pad 400 shown in FIGS. 4A and 4B, for example, which may drag the polishing tape 206. The decreased friction may result in less wear and tear on the polishing tape 206, for example, thereby increasing the usable life of the polishing tape 206. Additionally, the decreased friction may result in a decrease of particle formation, as particle formation may be undesirable due to its ability to interfere with the polishing system components and substrate production. The roller backing pad 400 may also have a greater usable lifespan than the non-rotating backing pad 400 shown in FIGS. 4A and 4B, for example. This may be because the substrate, rotating at a particular speed and pressure, may be pressed into a single fixed location against the polishing tape 206 and in turn the non-rotating backing pad 400 shown in FIGS. 4A and 4B, for example, and may create a groove in the non-rotating backing pad 400, which in turn may impact the process performance.

The material used to form the backing pad 400 may be firm enough, as described further below, to cause a good contact between the polishing tape 206 and the substrate 100. The material may also have a low coefficient of friction and a high wear resistance. Alternatively, as described above, the backing pad 400 may have an adjustable amount of ability to conform to the substrate edge 104 (and edge exclusion zones 108, 108'), or other areas being polished. Backing pads 400 with the ability to conform to the substrate edge 104 (and edge exclusion zones 108, 108'), for example, may still cause a good contact between the polishing tape 206 and the substrate 100. In some embodiments, the softer the material, the more conformable the material may be to the substrate edge 104 (and edge exclusion zones 108, 108'), which in turn may better distribute the contact pressure and improve the contact between the backing pads 400 and the substrate edge 104 (and edge exclusion zones 108, 108'). Additionally, the softer the material, the more the force from the backing pad 400 may be spread on the substrate 100, which may avoid damage or scratches on the substrate, for example. Materials that may be used to form the backing pad 400 may include, for example, PTFE, PEEK, Delrin, stainless steel or ceramics. Other suitable materials may be used. In some embodiments, the hardness of the backing pads 400 may range from approximately 60 to approximately 90 Shore A Durometers. Other hardnesses may be used.

Figure 5A:
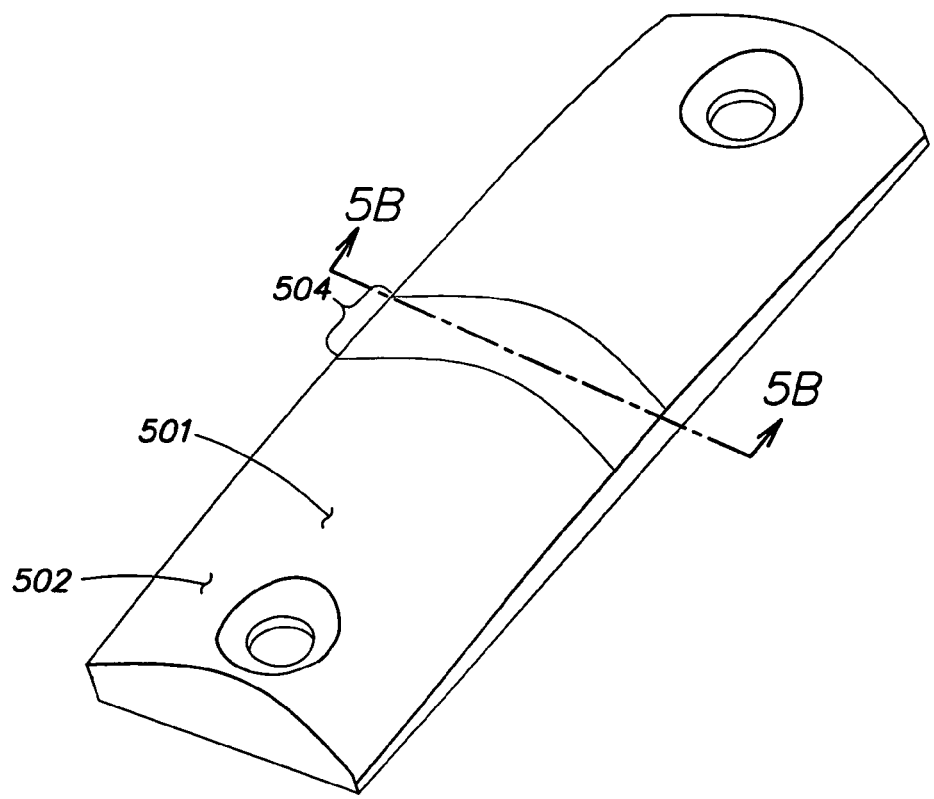
FIGS. 5A and 5B are an example embodiment of a backing pad according to the present invention.
Figure 5B:
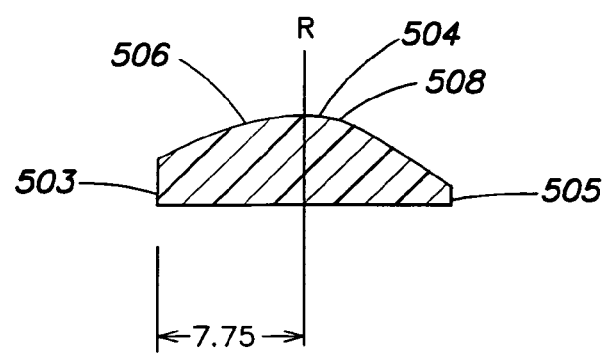

Turning to FIGS. 5A and 5B, an example embodiment of a backing pad 500 according to the present invention is depicted. Similarly to the backing pad 400 in FIG. 4A, the backing pad 500 shown in FIG. 5A has a curved top surface 502 contoured in perpendicular directions 501 from a central location, and forming a strip 504. In the example embodiment shown herein, the center of rotation (R) (shown in cross-section FIG. 5B) may act as the central location. Other central locations may be used. However, unlike the strip 402 in FIG. 4, the strip 504 in FIGS. 5A and 5B, is asymmetrically contoured. As shown in FIG. 5B, which is a cross section taken along line 5B-5B in FIG. 5A, the strip 504 herein includes two different radii (506,508), each corresponding to the top and bottom exclusion region 108,108', and edge 104 of the substrate 100. In other words, the contour 501 (or downward angle) of the polishing strip 504 from a first edge 503 of the polishing pad 500 to a center of rotation (R) is different (in this case smaller) than the top contour 501 (or downward angle) of the polishing strip 504 from a second edge 505 of the polishing pad 500 to the center of rotation (R). The backing pad 500 shown in FIGS. 5A and 5B may provide a well-defined film edge on the top exclusion zone 108, bevel 112 and outer edge 110 of the substrate 100, by using the small radius, and a less defined edge on the bottom exclusion zone 108', bevel 114, and outer edge 110 of the substrate 100, using the larger radius. In some embodiments, by providing a less defined edge, the rate of polishing may increase. As the bottom exclusion zone 108', bevel 114, and outer edge 110 of the substrate 100 may not receive electronics, the bottom exclusion zone 108', bevel 114 and outer edge 110 of the substrate 100 may not need a clear defined film edge.

Additionally, as the regions on the surface 502 of the backing pad 500 may be directly mapped to corresponding regions on the substrate 100, as described above, the mapping may be used to add flexibility in the design of the backing pad 500 to perform at different parameters as required by the process.

Figure 6A:
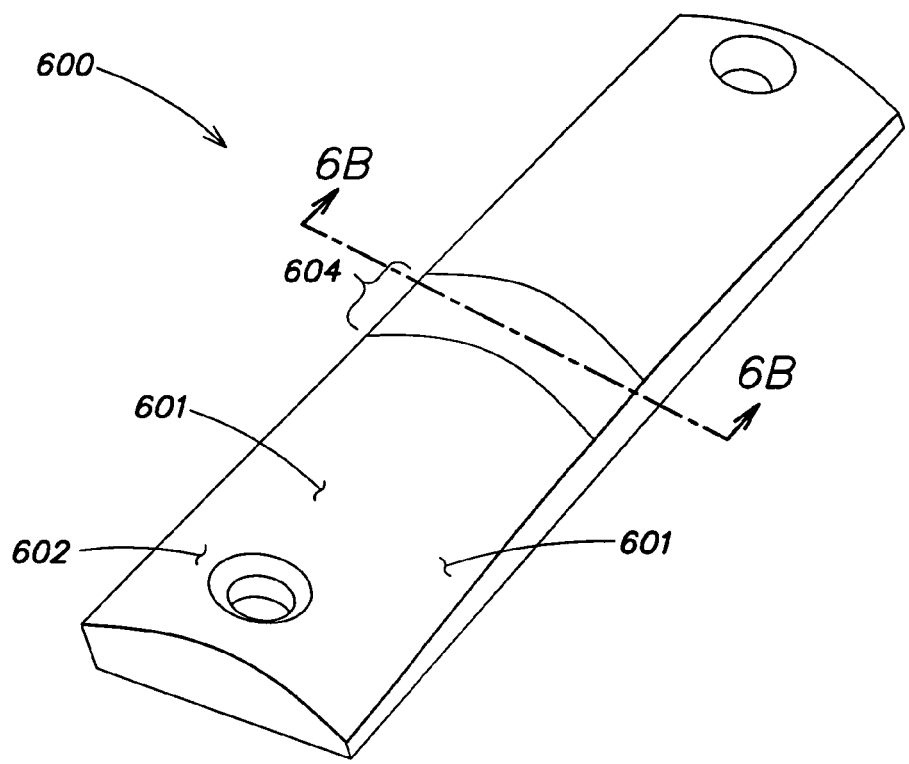
FIGS. 6A and 6B are an example embodiment of a backing pad according to the present invention.
Figure 6B:
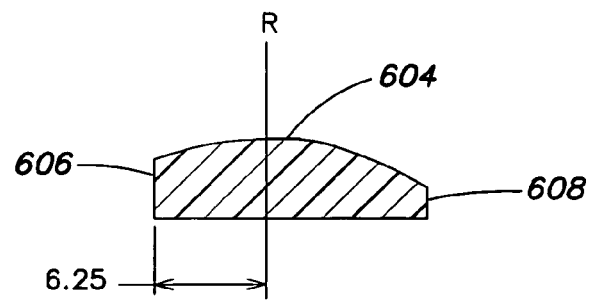

Turning to FIGS. 6A and 6B, an example embodiment of a backing pad 600 according to the present invention is depicted. Similarly to the backing pads 400 and 500 shown in FIGS. 4A, 4B, 5A and 5B, respectively, the backing pad 600 shown in FIG. 6A has a curved top surface 602 contoured 601 in perpendicular directions from a central location, and forming a polishing strip 604. As also described above, the contour 601 along the polishing strip 604 may be modified for different requirements. For example, from a first polishing pad edge 606 to a center of the polishing strip 604, the contour 601 of the curved top surface 602 is not the same as the contour 601 of the curved top surface 602 from the center of the polishing strip 604 to a second polishing pad edge 608. As shown in FIG. 6B, which is a cross section taken along line 6B-6B in FIG. 6A, the axis of rotation (R) is not centered. For example, as described above, the centered axis of rotation in FIGS. 4A, 4B and FIGS. 5A, 5B is 7.75 units from each of the first and second edge 406, 408, 503, 505 in FIGS. 4A/4B and FIGS. 5A/5B, respectively. However, in FIG. 6, the off-centered axis of rotation (R) is 6.25 units from the first polishing pad edge 606 and 9.25 units from the second polishing pad edge 608. Other measurements may be used. This off-centered design may allow different areas on the top and bottom exclusion region 108,108', and edge 104 of the substrate 100 to be polished. The off-centered design may be determined based on process requirements.

Figure 7:
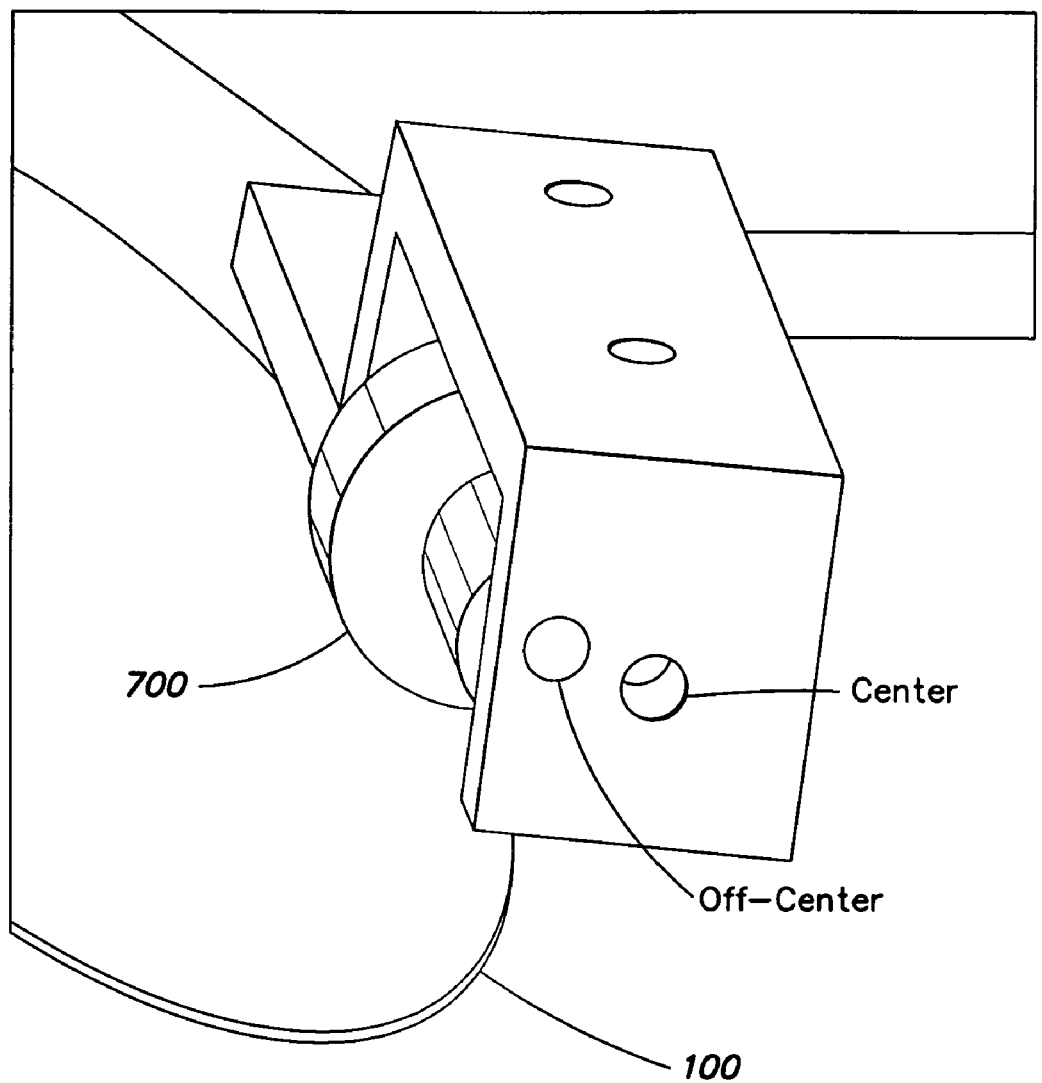
FIG. 7 is an example embodiment of a backing pad according to the present invention.

Turning to FIG. 7, an example embodiment of a backing pad 700 according to the present invention is depicted. The backing pad 700 of FIG. 7 is shaped as a roller, similar to the roller embodiment shown in FIG. 4C, and may incorporate the features of backing pads 400, 500 and 600. In other words, as described above, the roller backing pad 700 may, via the polishing tape 206, symmetrically remove film from both the top and bottom exclusion regions 108,108', and edge 104 of the substrate 100 similarly to the backing pad 400 shown in FIGS. 4A and 4B. The roller backing pad 700, via the polishing tape 206, may remove film from the top and bottom exclusion regions 108,108', and edge 104 of the substrate 100 in an asymmetric manner (i.e., a different amount from the top exclusion region 108 and bevel 112 and top edge 110 compared to the bottom exclusion region 108', bevel 114 and bottom edge 110). The asymmetric removal of film may be achieved via different selected rocker angles for the top exclusion region 108, bevel 112 and top edge 110 compared to the bottom exclusion region 108', bevel 114 and bottom edge 110. Additionally, the roller backing pad 700 may be mounted off-center within the polishing head 201. The off-center mounting may also allow the roller backing pad 700 to remove film from the top and bottom exclusion regions 108, 108', and edge 104 of the substrate 100 in an asymmetric manner. In other words, for the same selected angle of rotation, a different amount of film may be removed from the top exclusion region 108, bevel 112 and top edge 110 compared to the bottom exclusion region 108', bevel 114 and bottom edge 110, which may achieve similar results as the off-centered backing pad 600 described in FIG. 6. In some embodiments, when a large amount of film is selected to be removed from the top exclusion region 108, top bevel 112, and edge 110, compared to the bottom exclusion region 108', bottom bevel 114 and edge 110, the off-centered roller 700 may be more efficient than selecting different rocking angles for the top exclusion region 108 and top bevel 112, and edge 110, compared to the bottom exclusion region 108', and bottom bevel 114 and edge 110. In some embodiments, the roller backing pad 700 may have contours on the cylindrical surface, which may distribute the contact forces on the substrate edge 103. The shape of the contour may be different based on the type of polishing application or the area of the substrate being polished, for example. Additionally, the different pads 400, 500, 600, and 700 may be modular or easily replaceable, such that pads 400, 500, 600, and 700 with different contours may be selected depending on the type of polishing application being performed.

Additionally, as described above, the use of a roller backing pad 700 may decrease the frictional forces acting on the motion of the polishing tape 206, shown in FIG. 2, and therefore may enhance the performance of the roller backing pad 700. The decreased frictional force may also reduce the wear of the backing pad 700, as well as the polishing tape 206.

Figure 8:
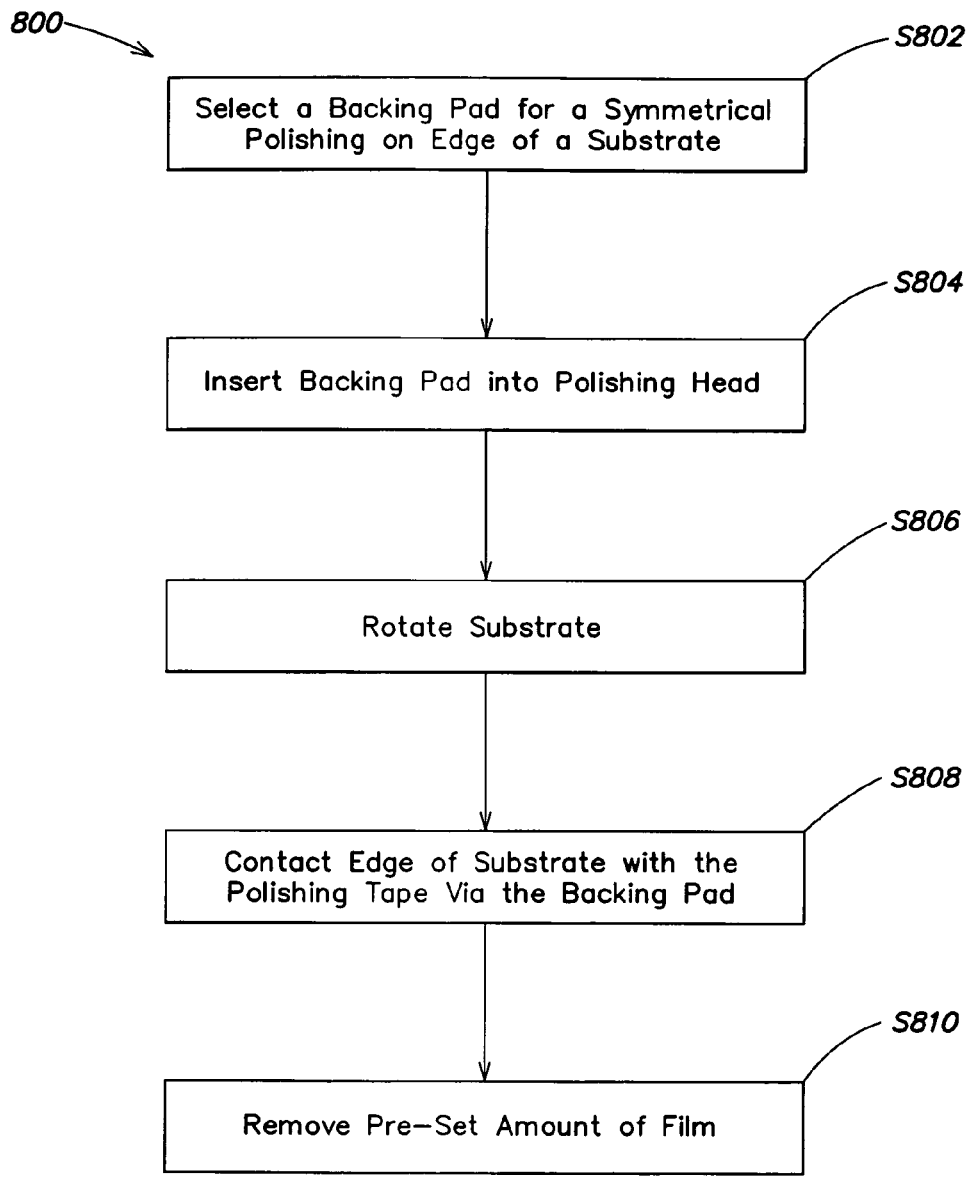
FIG. 8 is a flowchart depicting an example application of the present invention.

FIG. 8 is a flowchart depicting an example application 800 of the present invention. In step S802, a backing pad 400 for a symmetrical polishing on the edge 104 (and edge exclusion zones 108, 108') of a substrate 100 is selected. The backing pad may be selected based on the contour of the backing pad used for a particular polishing application. The backing pad 400 is inserted into the polishing head 200 in step S804. In step S806, the substrate 100 is rotated via a vacuum chuck, for example. In step S808, the backing or polishing pad 400 contacts the polishing tape 206, which in turn contacts the edge 104 (and edge exclusion zones 108, 108') of the substrate 100 The backing pad may rock about the edge 104 (and edge exclusion zones 108, 108') of the substrate 100. The rocking motion may allow the contours of the backing pad 400 to appropriately contact and polish the substrate edge 104 (and edge exclusion zones 108, 108'). A selected amount of film is removed from the substrate 100 in step S810. In some embodiments, for example, sensors may be used to determine that a pre-set or selected amount of film has been removed. Alternatively, for example, the rocking motion may continue for a pre-set or selected amount of time, whereby it has previously been determined that rocking the polishing pad for the selected amount of time removes a particular amount of film from the substrate. Other suitable methods may be used to determine a selected amount of film has been removed from the substrate.

It should be understood that the inventive edge polishing apparatus described herein may be employed in apparatuses other than those adapted for bevel and edge polishing and/or removal of films on substrates. Further, as will be apparent to those of ordinary skill in the art, the apparatus described herein may be employed to polish and/or remove films on an edge of a substrate supported in any orientation (e.g., horizontal, vertical, diagonal, etc).

Further, it should be understood that although only examples of cleaning a round substrate are disclosed, the present invention could be modified to clean substrates having other shapes (e.g., a glass or polymer plate for flat panel displays). Further, although processing of a single substrate by the apparatus is shown above, in some embodiments, the apparatus may process a plurality of substrates concurrently.

The foregoing description discloses only exemplary embodiments of the invention. Modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. An apparatus for polishing an edge of a substrate comprising:
    a backing pad coupled to a polishing head, wherein the backing pad has a first selected contour that extends from a first edge of the backing pad to an axis of rotation, and a second selected contour that extends from a second edge of the backing pad to the axis of rotation, and wherein the polishing head is adapted to press the backing pad against an edge of a substrate;
    wherein the first edge of the backing pad is opposite the second edge of the backing pad;
    wherein the first selected contour is different from the second selected contour; and
    wherein the first selected contour is adapted to form a first film profile on a top exclusion zone and bevel of the substrate and the second selected contour is adapted to form a second film profile on a bottom exclusion zone and bevel of the substrate.

2. The apparatus of claim 1 wherein the backing pad includes a polishing strip.

3. The apparatus of claim 2 wherein the polishing strip is adapted to contact polishing tape to polish the substrate edge.

4. The apparatus of claim 3 wherein the polishing strip is asymmetrically contoured.

5. The apparatus of claim 1 wherein the backing pad has a selected axis of rotation for rocking about the edge of the substrate.

6. The apparatus of claim 1 wherein the polishing head has a selected angle of rocking.

7. The apparatus of claim 1 wherein the backing pad is adapted to conform to the substrate edge.

8. A system for polishing an edge of a substrate comprising:
    a substrate support adapted to rotate a substrate; a backing pad coupled to a polishing head, wherein the backing pad has a first selected contour that extends from a first edge of the backing pad to an axis of rotation, and a second selected contour that extends from a second edge of the backing pad to the axis of rotation, wherein the first edge is opposite the second edge, and wherein the first selected contour is different from the second selected contour, and wherein the polishing head is adapted to press the backing pad against an edge of the substrate such that the first selected contour is adapted to form a first film profile on a top bevel of the edge of the substrate and the second selected contour is adapted to form a second film profile on a bottom bevel of the edge of the substrate; and a controller adapted to operate the rotation of the substrate and the polishing head.

9. The system of claim 8 wherein the backing pad includes a polishing strip.

10. The system of claim 9 wherein the polishing strip is asymmetrically contoured.

11. The system of claim 8 wherein the backing pad is adapted to conform to the edge of the substrate.

12. The system of claim 8 wherein the backing pad has a selected axis of rotation for rocking about the edge of the substrate.

13. The system of claim 8 wherein the polishing head has a selected angle of rocking.

14. The system of claim 9 further comprising a polishing tape.

15. The system of claim 14 wherein the polishing strip is adapted to press the polishing tape against the substrate edge.

16. A method for polishing an edge of a substrate comprising:

rotating a substrate;

providing a backing pad having a first selected contour extending from a first edge of the backing pad to an axis of rotation and a second selected contour extending from a second edge of the backing pad to the axis of rotation, wherein the first selected contour is different from the second selected contour;

contacting an edge of a substrate with polishing tape, wherein the polishing tape is contacted by the polishing strip section of the backing pad via a polishing head;

forming a first film profile on a top exclusion zone and bevel of the substrate with the first selected contour;

forming a second film profile on a bottom exclusion zone and bevel with the second selected contour; and determining that a selected amount of film has been removed from the substrate edge.

17. The method of claim 16 further comprising:

rocking the polishing head about the edge of the substrate prior to determining the selected amount of film has been removed.

18. The method of claim 17 wherein the polishing head is rocked about the substrate edge for a selected amount of time.

19. The method of claim 16 wherein the polishing strip is asymmetrically contoured.

20. The method of claim 17 further comprising:

contacting a top bevel of the substrate at a first angle of rocking and contacting a bottom bevel of the substrate at a second angle of rocking, where the first and second angles of rocking are different.

* * * * *